US005773328A

United States Patent [19]
Blanchard

[11] Patent Number: 5,773,328
[45] Date of Patent: Jun. 30, 1998

[54] METHOD OF MAKING A FULLY-DIELECTRIC-ISOLATED FET

[75] Inventor: Richard A. Blanchard, Los Altos, Calif.

[73] Assignee: SGS-Thomson Microelectronics, Inc., Carrollton, Tex.

[21] Appl. No.: 474,710

[22] Filed: Jun. 7, 1995

Related U.S. Application Data

[63] Continuation-in-part of Ser. No. 397,654, Feb. 28, 1995, Pat. No. 5,668,025.

[51] Int. Cl.⁶ .................................................. H01L 21/00
[52] U.S. Cl. ........................ 438/162; 438/489; 438/300; 438/295
[58] Field of Search ............................. 437/26; 438/162, 438/489, 300, 295

[56] References Cited

U.S. PATENT DOCUMENTS

| | | | |
|---|---|---|---|
| 4,420,870 | 12/1983 | Kimura | 438/162 |
| 4,487,639 | 12/1984 | Lam et al. | |
| 4,863,878 | 9/1989 | Hite et al. | 438/162 |
| 4,874,716 | 10/1989 | Rao | |
| 5,091,334 | 2/1992 | Yamazaki et al. | 438/162 |
| 5,527,724 | 6/1996 | Brady et al. | 438/162 |
| 5,554,547 | 9/1996 | Ha | 438/162 |
| 5,614,433 | 3/1997 | Mandelman | 438/162 |

OTHER PUBLICATIONS

Cao et al., "Low Pressure Chemical Vapor Deposition of $Si_{1-x}Ge_x$ Films in $SiO_2$," 143 J. Electrochem. Soc. 1566 (1995).
Isihkawa et al., "Formation mechanisms of discoloration and Si island low–energy Simox," B91 Nuclear Instruments & Metohds in Physics Researcg B 520 (1994).
Li et al., effects of dose and target temperature on low energy Simox layers, 140 J. Electrochemical Society 1780 (1993).
Nejim et al., "Direct formation of device worthy thin film Simox structures by low energy oxygen implantation," 822 (1993) B80–81 Nuclear Instruments & Methods in Physics Research B.
Li et al., "The effects of dose and target temperature on low energy Simox layers," Proceedings of the Fifth International Symposium on Silicon–on–Insulator Technology and Devices 368 (1992).
Reimbold et al., "Aging analysis of nMOS of a 1.3–$\mu$m partially depleted Simox SOI technology comparison with a 1.3–$\mu$m bulk technology," 40 IEEE Trans'ns Electron Devices 364 (1993).
Usami et al., "Evaluation of bonding silicon–on–insulator films with deep–level transient spectroscopy measurements, "E75–C IEICE Trans'ns Electronics 1049 (1992).
Takao et al., "Low–power and high–stability SRAM technology using a laser–recrystallized p–channel SOI MOFET," 39 IEEE Tran'ns Electron Devices 2147 (1992).
Nakashima et al.., "Buried oxide layers formed by low–dose oxygen implantation," 7 J. Materials Research 788 (1992).
Barklie et al., "E'$_1$ cnetres in buried oxide layers formed by oxygen ion implantation into silicon," B65 Nuclear Instruments & Methods in Physics Research B 93 (1992).
Bae et al., "The effects of annealing conditions on the characteristics of Simox SOIU," 28A J. Korean Institute of Telematics and Electronics 54 (1991).

(List continued on next page.)

Primary Examiner—Charles L. Bowers, Jr.
Assistant Examiner—Lynne A. Gurley
Attorney, Agent, or Firm—David V. Carlson; Theodore G. Galanthay; Lisa K. Jorgenson

[57] ABSTRACT

A field-effect transistor structure wherein a single patterned thin film semiconductor layer: is monocrystalline, and epitaxially matched to and dielectrically isolated from an underlying body region, in channel locations; and is polycrystalline in source/drain locations which abut said channel locations.

30 Claims, 4 Drawing Sheets

OTHER PUBLICATIONS

Visitserngtrakul et al., "Mechanisms of defect formation and evolution in oxygen implanted silicon–on–insulator material," in Microscopy of Semiconducting Materials 1989 at 557.

Lacquet et al., "Ultraviolet reflectance of room temperatures nitrogen implanted silicon (SOI)," 1989 IEEE SOS/SOI Technology Conference at 110.

Fechner et al., "Physical characterization of low defect Simox materials," 1989 IEEE SOS/SOI Technology Conference at 70.

De Veirman et al., "Defects in high–dose oxygen implanted silicon," 38–41 Materials Science Forum 207 (1989).

Cristoloveanu, "Electrical evaluation of Simox material and integrated device," in Silicon–on–Insulator and Buried Metals in Semiconductors at 335 (ed. Sturm et al. 1988).

Scanlon et al., "Evidence fo oxygen concentration changes induced by low–temperature 0–18 implantation into a Simox buried–oxide layer," in Silicon–on–Insulator and Buried Metals in Semiconductors at 141 (ed. Sturm et al. 1988).

de Veirman et al., "HVEM and electrical characterisation of Simox Stuctures," in Silicon–on–Insulator and Buried Metals in Semiconductors at 129 (ed. Sturm et al. 1988).

Nieh et al., "Formation of buried oxide in MeV oxygen implanted silicon," in Silicon–on–Insulator and Buried Metals in Semiconductors at 73 (ed. Sturm et al. 1988).

Sioshansi et al., "Processing Simox wafer below the critical temperature," in Silicon–on–Insulator and Buried Metals in Semiconductors at 67 (ed. Sturm et al. 1988).

Stoemenas, "Silicon on Insulator Obtained bu High Dose Oxygen Implantation, Microstructure, and Formation Mechanism," 142 J. Electrochem. Soc. 1248 (1995).

Auberton–Hervé et al., "SOI substrates for low–power LSIs," Solid States Technology, Mar. 1995, at 87.

Tukune, et al., "Spontaneous Polysilicon and Epitaxial Silicon Deposition," 142 J. Electrochem. Soc. (1995).

METHOD OF MAKING A FULLY-DIELECTRIC-ISOLATED FET

CROSS REFERENCE TO RELATED APPLICATION

The present application is a continuation-in-part of Ser. No. 08/397,654 filed Feb. 28, 1995 (now U.S. Pat. No. 5,668,025).

BACKGROUND AND SUMMARY OF THE INVENTION

The present inventions relate to integrated circuit devices and processes, and particularly to CMOS devices and processes which are highly resistant to latchup.

Background: Latchup

Latchup is one of the basic problems of CMOS technology. Consider the sequence of a PMOS source region, the surrounding N-well region, a p-well region (or p-type epitaxial layer), and an NMOS source region. This sequence of regions will inevitably occur in normal bulk CMOS designs, and it defines a thyristor. This thyristor is referred to as "parasitic," since it is not created intentionally. A thyristor is a bipolar device which has an extremely low on-resistance. Once the thyristor turns on (or "fires"), it will remain on for as long as it can draw its minimum holding current. This behavior is extremely undesirable in integrated circuits, since when such a parasitic thyristor fires it may destroy the integrated circuit (by drawing excessive current), or may rapidly discharge a portable system's battery, or may simply cause the chip to remain in a "stuck" condition, and hence become unusable, until the power supply is disconnected.

Any thyristor can be regarded as a merger of a PNP transistor with an NPN transistor, and this model is frequently a convenient way to analyze the properties of the parasitic thyristor. The gain of the parasitic thyristor is equal to the product of the gains of the bipolar transistors, so degrading the gain of either parasitic bipolar helps to degrade the parasitic thyristor. (Although the thyristor reaches low impedance once triggered, it is still useful to analyze the small-signal "gain" of the thyristor in considering triggering: lower gain will mean that a larger input energy is required to trigger the thyristor. Since voltage transients are always present, it is desirable to provide some margin of immunity against triggering by transients.) There are several ways to approach the device-level properties of the thyristor: either the holding current can be increased, or the firing voltage can be increased, or the gain of one or both of the parasitic bipolar transistors can be degraded, or low-resistance shunting elements can be added to bypass one or both of the parasitic bipolar transistors (so that the current driven by one transistor does not all appear as base current on the other).

Background: Punchthrough

Another of the basic problems in normal CMOS (or almost any other field-effect transistor formed in bulk material) is punchthrough: when the depletion regions around the source/drain boundaries spread sufficiently to touch, then current can bypass the channel region, i.e. the source and drain are essentially shorted together.

Background: Thin Film Transistors and Full Dielectric Isolation

An old goal in MOS processing has been to manufacture transistors which are separated from each other by dielectric layers, and not merely by reverse-biased junctions. However, this is not easy to achieve.

One way to obtain some of the advantages of full dielectric isolation is with thin-film transistors. Such transistors are fabricated with their channel regions in a deposited thin film layer (typically polycrystalline Si or SiGe). Thin-film transistors do provide full dielectric isolation, but they typically suffer from low mobilities and high junction leakage currents.

Background: SOI and SIMOX

It has long been realized that silicon-on-insulator (SOI) structures, in which a layer of monocrystalline silicon overlies a layer of an insulator, would permit full dielectric isolation. Since the 1970s various techniques have been proposed for SOI, and many successful results have been published, but none of these techniques have remained in production use. (The nearest approach was the silicon-on-sapphire technology which was aggressively promoted by RCA.)

However, a new approach which was developed in the 1980s has begun to see mass production in the mid-1990s. This is the "SIMOX" approach, which uses high-dose oxygen implantation (followed by a significant anneal) to form a buried silicon dioxide layer under silicon which is still monocrystalline. Many articles have shown how to practice this process; see e.g. Ishikawa et al., "Formation mechanisms of dislocation and Si island in low-energy SIMOX," B91 NUCLEAR INSTRUMENTS & METHODS IN PHYSICS RESEARCH B 520 (1994); Li et al., effects of dose and target temperature on low energy SIMOX layers," 140 J. ELECTROCHEMICAL SOCIETY 1780 (1993); Nejim et al., "Direct formation of device worthy thin film SIMOX structures by low energy oxygen implantation," B80–81 NUCLEAR INSTRUMENTS & METHODS IN PHYSICS RESEARCH B 822 (1993); Li et al., "The effects of dose and target temperature on low energy SIMOX layers," PROCEEDINGS OF THE FIFTH INTERNATIONAL SYMPOSIUM ON SILICON-ON-INSULATOR TECHNOLOGY AND DEVICES 368 (1992); Reimbold et al., "Aging analysis of nMOS of a 1.3-$\mu$m partially depleted SIMOX SOI technology comparison with a 1.3-$\mu$m bulk technology," 40 IEEE TRANS'NS ELECTRON DEVICES 364 (1993); Usami et al., "Evaluation of bonding silicon-on-insulator films with deep-level transient spectroscopy measurements," E75-C IEICE TRANS'NS ELECTRONICS 1049 (1992); Takao et al. . , "Low-power and high-stability SRAM technology using a laser-recrystallized p-channel SOI MOSFET," 39 IEEE TRANS'NS ELECTRON DEVICES 2147 (1992); Nakashima et al. . , "Buried oxide layers formed by low-dose oxygen implantation," 7 J. MATERIALS RESEARCH 788 (1992); Barklie et al., "E'$_1$ centres in buried oxide layers formed by oxygen ion implantation into silicon," B65 NUCLEAR INSTRUMENTS & METHODS IN PHYSICS RESEARCH B 93 (1992); Bae et al., "The effects of annealing conditions on the characteristics of SIMOX SOI," 28A J. KOREAN INSTITUTE OF TELEMATICS AND ELECTRONICS 54 (1991); Visitserngtrakul et al., "Mechanisms of defect formation and evolution in oxygen implanted silicon-on-insulator material," in MICROSCOPY OF SEMICONDUCTING MATERIALS 1989 at 557; Lacquet et al., "Ultraviolet reflectance of room temperatures nitrogen implanted silicon (SOI)," 1989 IEEE SOS/SOI TECHNOLOGY CONFERENCE at 110; Fechner et al., "Physical characterization of low defect SIMOX materials," 1989 IEEE SOS/SOI TECHNOLOGY CONFERENCE at 70; De Veirman et al., "Defects in high-dose oxygen implanted silicon," 38–41 MATERIALS SCIENCE FORUM 207 (1989); Cristoloveanu, "Electrical evaluation of SIMOX material and integrated devices," in SILICON-ON-INSULATOR AND BURIED METALS IN SEMICONDUCTORS at 335 (ed. Sturm et al. 1988); Scanlon et al. "Evidence for oxygen concentration changes induced by low-temperature 0–18 implantation into a SIMOX buried-oxide layer," in SILICON-ON-INSULATOR AND BURIED METALS IN SEMICONDUCTORS at 141 (ed. Sturm et al. 1988); de Veirman et al.,"HVEM and electrical characterisation of SIMOX structures," in SILICON-ON-INSULATOR AND BURIED METALS IN SEMICONDUCTORS at 129 (ed. Sturm et al. 1988); Nieh et al., "Formation of buried oxide in MeV oxygen implanted silicon," in SILICON-ON-INSULATOR AND BURIED METALS IN SEMICONDUCTORS at 73 (ed. Sturm et al. 1988); Sioshansi et al. . , "Processing SIMOX wafer below the critical temperature," in SILICON-ON-INSULATOR AND BURIED METALS IN SEMICONDUCTORS at 67 (ed. Sturm et al. 1988); Stoemenas, "Silicon on Insulator Obtained by High Dose Oxygen Implantation, Microstructure, and Formation Mechanism," 142 J. ELECTROCHEM. Soc. 1248 (1995); and Auberton-Hervé et al., "SOI substrates for low-power LSIs," SOLID-STATE TECHNOLOGY, March 1995, at 87. All of these publications, and all of the references cited in them, are hereby expressly incorporated by reference. Note that some of this work has shown that implantation of nitrogen rather than oxygen can be used to form the buried dielectric layer.

Innovative CMOS Device and Process

One of the basic goals in the fabrication of thin film MOS transistors is to obtain the performance of MOS transistors that have been fabricated in single crystal silicon together with device-to-device isolation. The disclosed innovations allow the fabrication of dielectrically isolated thin film MOS transistors as well as other devices with both of these features.

The present application provides a CMOS device and process in which the source/drain and channel regions are fully dielectrically-isolated from the underlying silicon. This source/drain regions may be polysilicon, or may be recrystallized into monocrystalline material.

The parent application described a process device structure in which the source/drain regions (but not the channels) were separated from the substrate by underlying dielectric layers. The present application describes a modified process and device structure, in which the monocrystalline channel region, as well as the source/drain regions, are dielectrically isolated from the substrate. The substrate defines a crystal lattice for growth or recrystallization of the channel region, but thereafter is separated from the channel region by an oxygen implant which creates a buried oxide layer which creates full dielectric isolation. This results in a fully dielectrically-isolated structure, in which there is no possibility whatsoever of junction spiking or latch-up.

The parent application describes the fabrication of MOS transistors with sources and drains made in polysilicon, but with the channel region formed in monocrystalline silicon. The channel regions of MOS transistors fabricated in this fashion are common with the substrate. However, by implanting a high dose of oxygen, followed by the proper anneal step, a layer of silicon dioxide will be formed that separates the silicon channel region from the underlying substrate.

This technique can also be used to fabricate diodes and lateral bipolar transistors that have their junctions in the region of single crystal silicon. (In the bipolar transistor the device is lateral, with the base region also formed of single-crystal silicon.)

This technology differs significantly from conventional SIMOX technology, which uses ion implantation of oxygen to obtain dielectric isolation. In the present technology, the percentage of chip area that must be successfully annealed following the oxygen implant step is relatively low (just the area that has silicon exposed just prior to deposition of the first polysilicon layer). This reduction in the area requiring successful recrystallization increases the likelihood that the chip will operate as intended.

This technology can be combined with various process sequences for manufacturing discrete devices, conventionally integrated circuits, and power integrated circuits. This technology also retains the advantages described in the parent application.

Thus features and advantages of various embodiments of the disclosed inventions include:
1. This structure reduces the capacitance between the body and both the source and the drain.
2. The spacings between the diffused source/drain regions can be reduced, since these diffused regions are in polysilicon, and can be laterally separated by etching.
3. Contact spiking through source/drain regions is no longer a concern, since all source/drain regions now have a layer of dielectric beneath them.
4. Susceptibility to latch-up is reduced, since the source/drain diffusions are not in contact with the body regions.
5. The process steps used to provide the structures can be included in a more complex process sequence such as BiCMOS technology.
6. The basic structure can be used in a variety of technologies, including NMOS, PMOS, CMOS, DMOS, or JFET.

Note that the edge of the oxide which defines the active region is not self-aligned to the gate in the second polysilicon layer. This introduces an additional design parameter. For instance, by making the second polysilicon gate wider than the oxide opening which defines the width of the crystalline silicon region, a degree of underlap is achieved which may cause a region of more lightly doped silicon, having a doping determined by lateral diffusion which becomes lighter going from the drain to the channel, and thus automatically provides a lightly doped drain profile to reduce hot carrier effects. Manipulation of this kind can be used in combination with the conventional side-wall-oxide-defined LDD regions, or even with a conventional double-diffused graded drain (formed by differential diffusion of phosphorous plus arsenic). Unlike the conventional LDD and graded drain techniques, this new technique permits ASYMMETRY in the transistor, in that the source and drain regions do not have to have exactly the same profile. Thus the potential contour of the drain boundary can be optimized without adding series resistance on the source side.

The thickness of the oxide which is used to determine the size of the monocrystalline silicon region is not critical. Thus, again, the thickness of this oxide can be determined by other considerations. For example, in smart power processes, the oxide layer can be used for the gate oxide of VDMOS or LDMOS high voltage and/or high-current transistors.

In one class of embodiments, this device structure can be used for just one of the device types in a CMOS integrated circuit. For example, by making the PMOS devices, but not the NMOS devices, in the poly1/epi layer, the NMOS and PMOS devices can actually be overlapped with each other. (The removal of the PMOS devices from the substrate is enough to inhibit latchup.) Thus, this provides significant advantages in density.

Further advantages in density are provided by the improved tolerance to contact misalignment. In conventional structures, misalignment of a contact to the active area may result in etching through the corner of the field oxide to expose the channel stop diffusion (and thus potentially cause a short circuit). Similarly, a misaligned contact to polysilicon over active may make contact to the source/drain region. Normally design rules are selected to make these mishaps adequately unlikely, but the present invention permits these design rules to be relaxed (and hence improves density and/or yield).

In the presently preferred embodiment, the oxide which is used to define apertures where crystalline material will be grown is not itself field oxide, but is used in combination with a LOCOS field oxide which covers the margins of the P-well and N-well regions. Alternatively, various other techniques for field isolation can be used, or it may even be possible to eliminate the field oxide (IF the combination of on-chip voltages, dielectric thickness under the polysilicon lines, and substrate doping under the polysilicon lines combine, according to well-known formulas, so that the parasitic transistors do not turn on).

In a further class of embodiments, the same process flow can be used to provide a self-aligned channel stop implant. To implement this, a channel stop implant is performed (with an energy which is selected to reach through the oxide thickness), after the gate structure in poly-2 is in place. (Depending on the desired lateral spacing of the channel stop diffusions, this implant can be performed with or without sidewall spacers on the gate.) This technique provides an important further step toward a process with no conventional "thick field-oxide" at all. Such a process can provide the important advantages of reduced topography, reduced diffusion length of buried layers, and reduced process complexity.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
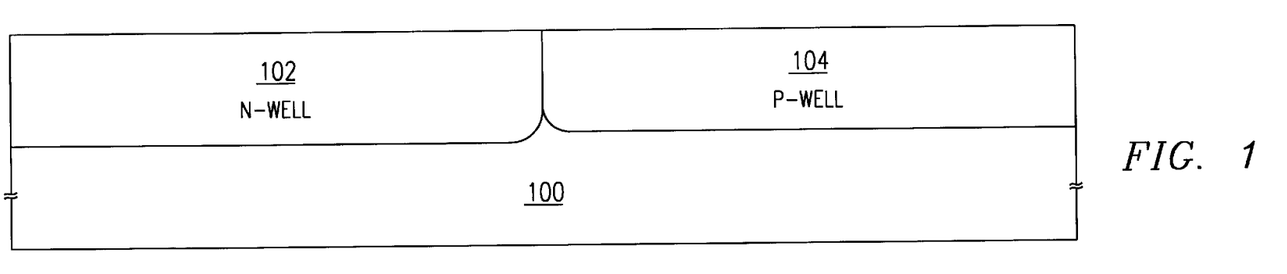
FIGS. 1–8 show sequential steps in fabrication of an integrated circuit device using the methods of the present invention.

The numerous innovative teachings of the present application will be described with particular reference to the presently preferred embodiment (by way of example, and not of limitation), in which:

FIG. 1 schematically shows a sample CMOS device structure after an N-well 102 and a P-well 104 have been fabricated in a monocrystalline substrate 100.

Figure 2:
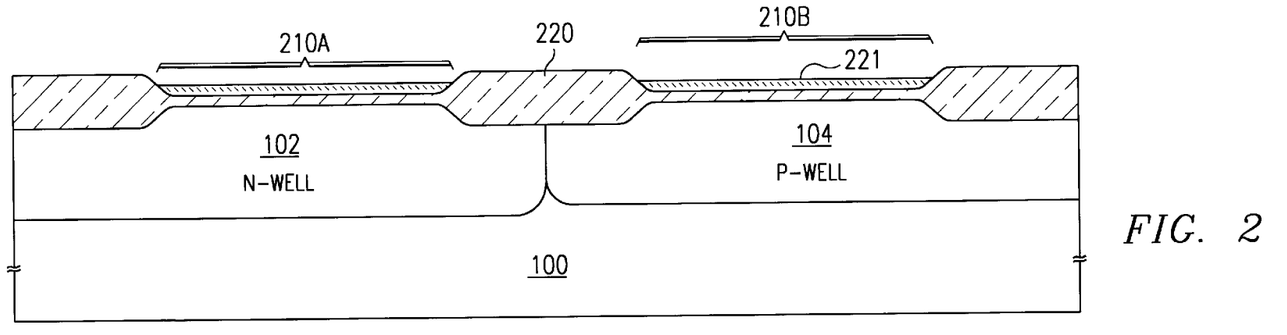

FIG. 2 schematically shows the structure of FIG. 1, after a LOCOS field oxide 220 (patterned using an oxide/nitride active stack 221) has been grown to define active areas 210A and 210B (for PMOS and NMOS devices respectively).

Figure 3:
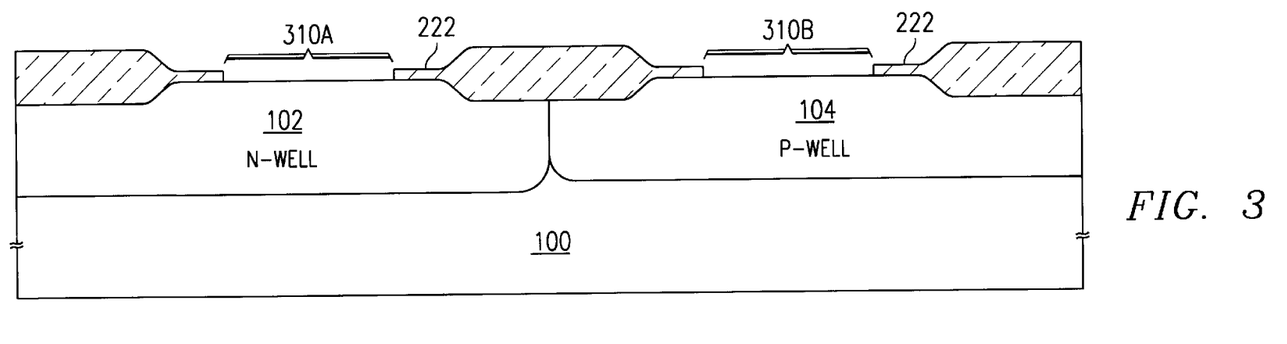

FIG. 3 schematically shows the structure of FIG. 2, after a thin oxide 222 has been grown over the active areas 210, and has been patterned to expose channel areas 310A and 310B within the active areas 210A and 210B. (This is a nonstandard step, and the importance of these channel areas will become apparent in FIG. 4.)

Figure 4:
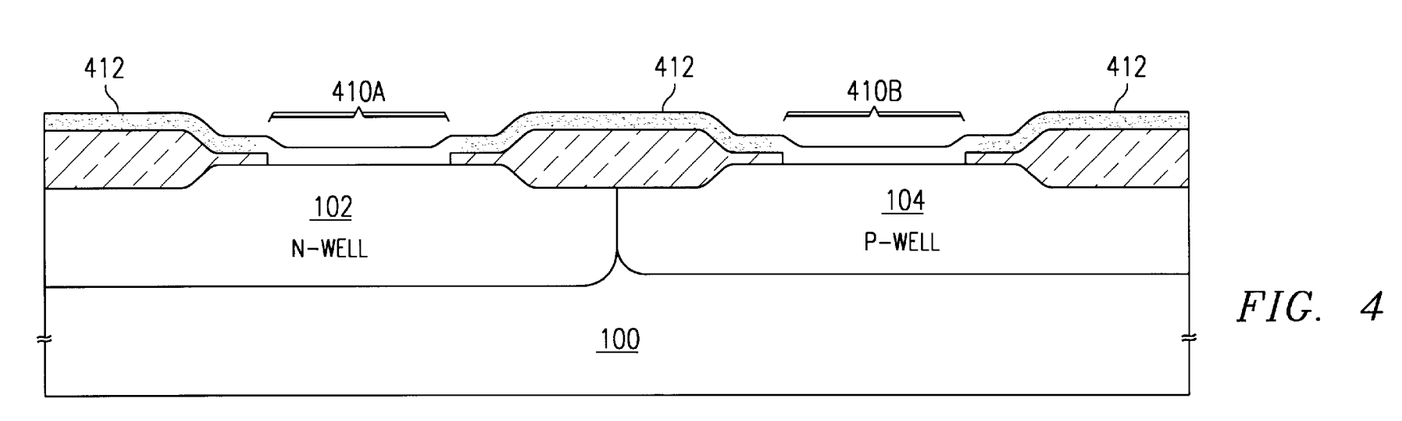

FIG. 4 schematically shows the structure of FIG. 3, after intrinsic silicon is deposited (e.g. at 900° C., to a thickness of 1000 Å). (Alternatively, the thickness of this layer can be in the range of 400–4000 Å, and the deposition temperature can be in the range of 800°–1000° C.). (This step is of course preceded by a cleaning step.) This step will epitaxially deposit a thin layer 410A or 410B of monocrystalline silicon over the channel region 310A or 310B respectively, and will deposit polycrystalline silicon 412 ("poly1") everywhere else.

Figure 4A:
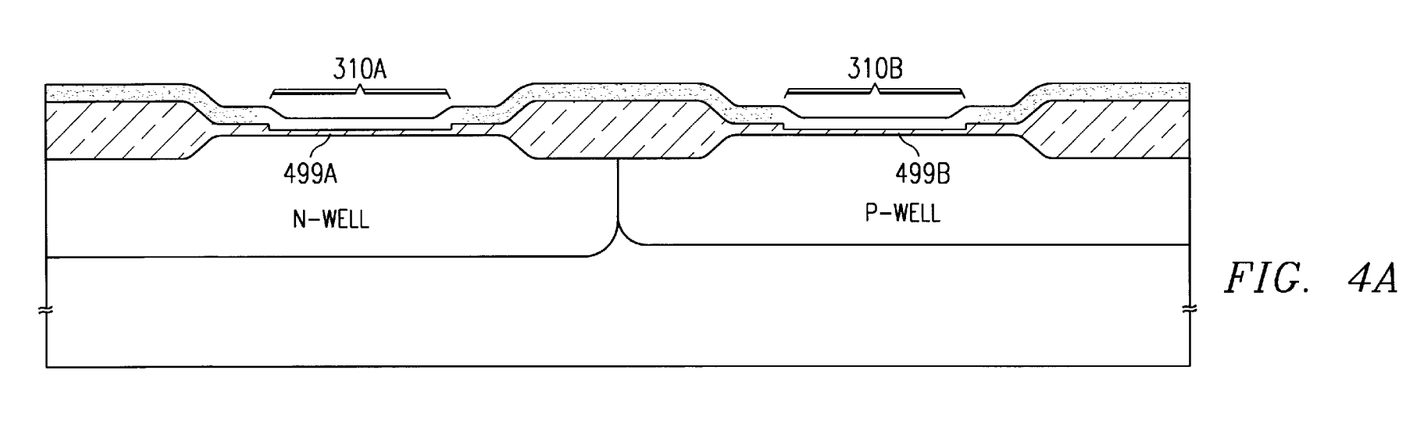

FIG. 4A schematically shows the structure of FIG. 4, after oxygen is implanted to form a shallow buried oxide layer 499 under the channel locations 310A and 310B. This is preferably a low-dose implant (e.g. in the range from about 1 to about $3 \times 10^{17}$ cm$^{-2}$), followed by a relatively short and low-temperature anneal (e.g. 900° C. for 30 min). Venables et al., "Low-dislocation-density silicon-on-insulator material produced by sequential oxygen implantation and low-temperature annealing," 60 APPLIED PHYSICS LETTERS 3147–9 (1992). This implant is optionally (and advantageously) performed under high-temperature conditions, as described in this article.

Figure 5:
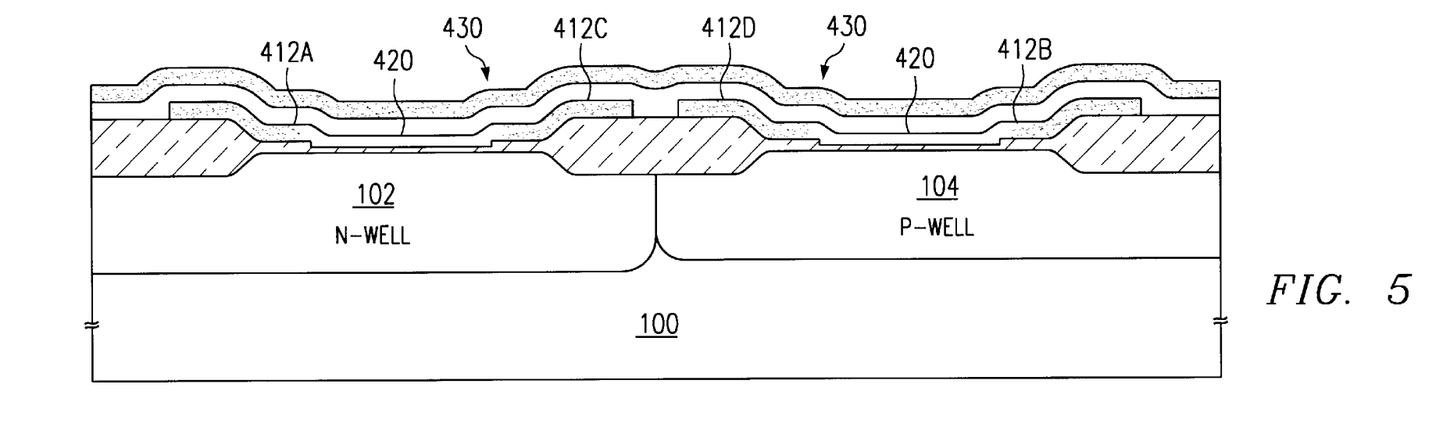

FIG. 5 schematically shows the structure of FIG. 4A, after a thin gate oxide 420 has been grown conventionally and a second polysilicon layer 430 has been conventionally deposited. The gate oxide 420 may be grown to e.g. 100 Å over the monocrystalline channel regions 410, and will typically be slightly thicker and rougher over the polycrystalline portion 412. A second polysilicon layer 430 ("poly2") is then deposited, e.g. to 3500 Å thick.

Figure 6:
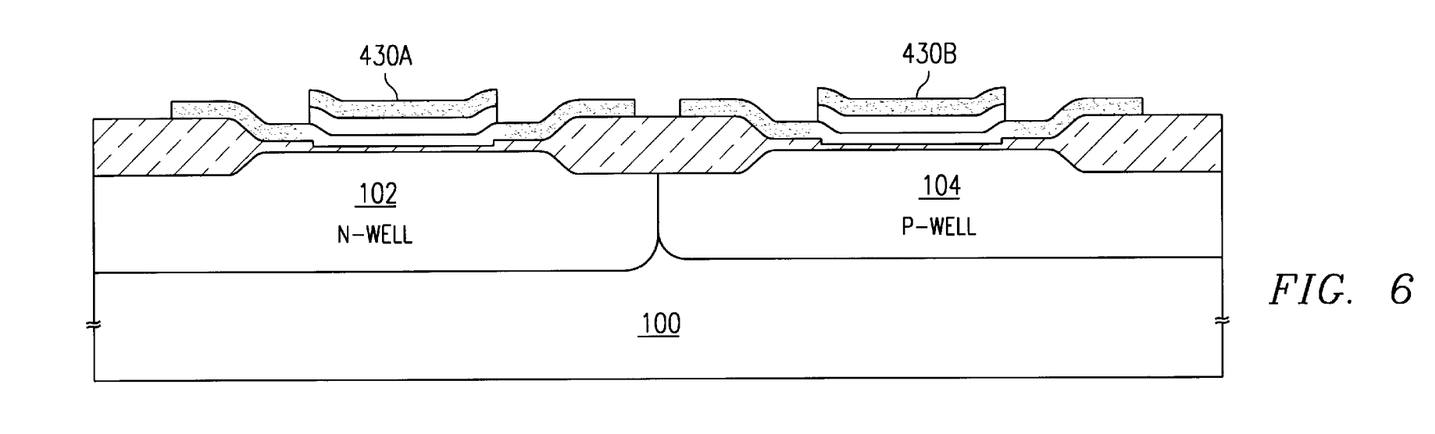

FIG. 6 schematically shows the structure of FIG. 5, after the poly2 layer has been patterned to produce a structure which includes, inter alia, PMOS gate portions 430A and NMOS gate portions 430B.

A salicide step can optionally be performed at this point (or optionally after source/drain implantation), to reduce the sheet resistance of poly1 regions 412 (by cladding them with silicide).

Figure 7:
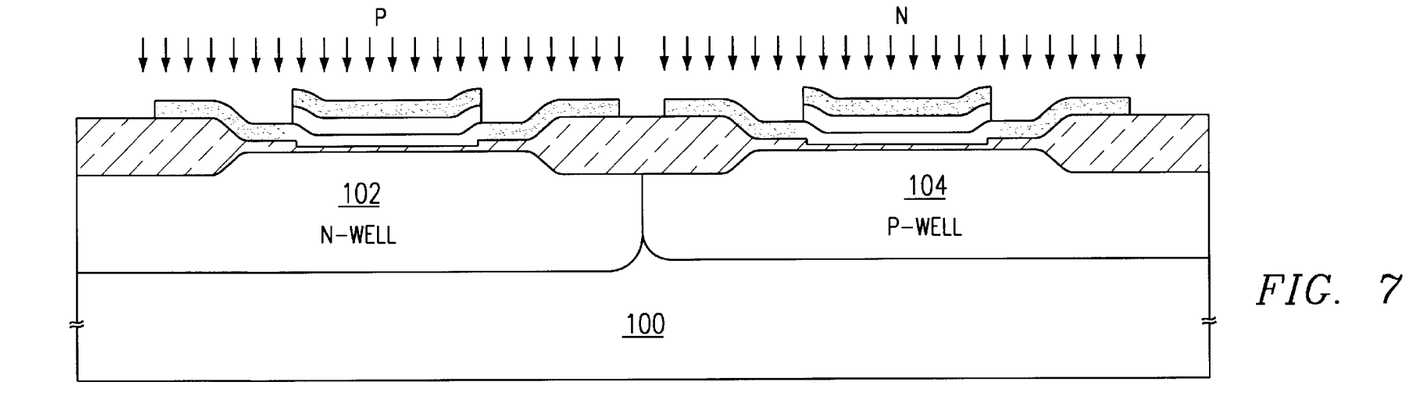

FIG. 7 schematically shows the structure of FIG. 6, during two further process steps: P-type dopants are applied in a shallow heavy implant (e.g. $10^{16}$ cm$^{-2}$ of BF$_2^-$ at 30 keV) to the area over the N-wells 102, and N-type dopants are applied in a shallow heavy implant (e.g. $5 \times 10^{15}$ cm$^{-2}$ of As$^+$ at 20 keV) to the area over the P-wells 104. Note that these implants dope some portions of the poly1 regions 412 N+, and other regions P+. The poly2 layer can be used to provide a short connection from N+ poly1 to P+ poly (particularly if a saliciding step has been performed as discussed above).

The poly2 layer will also be doped by this implant. By selecting the dose appropriately the second poly layer can be doped N+ over NMOS channel regions 410B, and P+ over PMOS channel regions 410A. This eliminates the work function difference which primarily causes VLSI PMOS devices to have buried channels.

Optionally sidewall spacers can be conventionally formed on the poly2 layer, to adjust the source/drain underlap.

Figure 8:
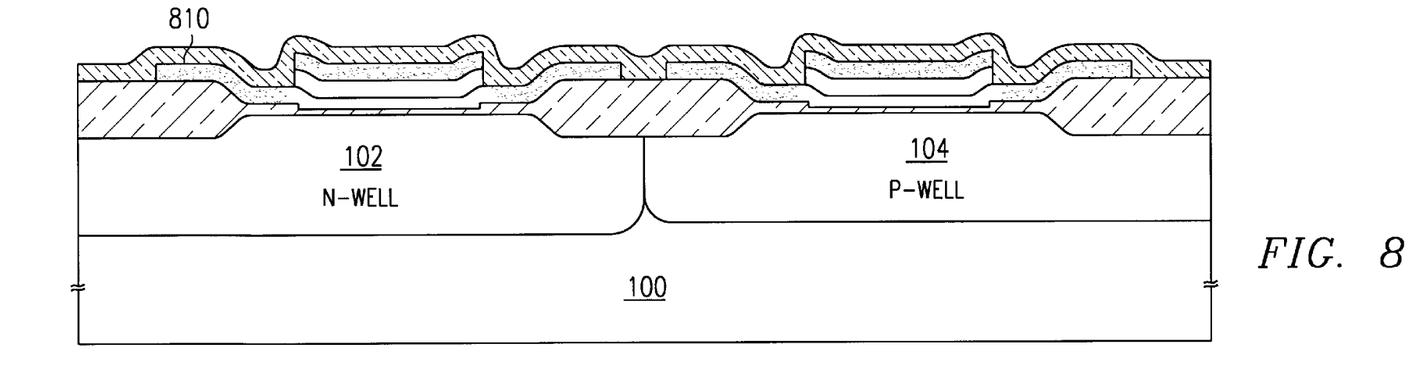

FIG. 8 schematically shows the structure of FIG. 7 after a final step of brief oxidation (to seal the poly1 and poly2 layers) and deposition of an interlevel dielectric 810 (e.g. BPSG over TEOS-deposited oxide).

Processing then continues conventionally, with formation of contact holes, formation of a patterned metal layer, formation of protective overcoat, and patterning to expose bond pad locations. Optionally, a third layer of polysilicon can be added to the process. Optionally, two or more layers of metallization can be used, using techniques well known to those of ordinary skill in the art.

According to a disclosed class of innovative embodiments, there is provided: A method for fabricating integrated circuit devices, comprising the steps of: providing substantially monolithic semiconductor material; covering part of the surface of said material with a patterned dielectric layer, said patterned dielectric layer leaving said material exposed in transistor channel locations; forming additional semiconductor material as monocrystalline semiconductor material on said transistor channel locations and as polycrystalline semiconductor material elsewhere; said semiconductor material being formed to a thickness which is greater than the thickness of said patterned dielectric layer; implanting an oxidizing species at an energy which forms a buried dielectric layer in said channel regions, and patterning said additional material to form a patterned thin film layer, and forming a gate dielectric on said additional material; forming an additional patterned conductive thin film layer on said gate dielectric; implanting dopants of a desired conductivity type into said additional material where exposed by said additional patterned conductive thin film layer; whereby monocrystalline portions of said additional material beneath said additional patterned conductive thin film layer form transistor channel regions, and polycrystalline portions of said additional material provide source and drain regions adjacent thereto.

According to another disclosed class of innovative embodiments, there is provided: A method for fabricating integrated circuit devices, comprising the steps of: providing substantially monolithic semiconductor material; covering part of the surface of said material with a patterned dielectric layer which leaves said monolithic body exposed in transistor channel locations; depositing additional semiconductor material overall, as epitaxially matched monocrystalline semiconductor material on said monolithic body in said transistor channel locations, and as polycrystalline semiconductor material elsewhere; said semiconductor material being formed to a thickness which is greater than the thickness of said patterned dielectric layer; implanting an oxidizing species at an energy which forms a buried dielectric layer in said channel regions, and patterning said additional material to form a patterned thin film layer, and forming a gate dielectric on said additional material; forming an additional patterned conductive thin film layer, comprising polycrystalline semiconductor material, on said gate dielectric; and implanting dopants of a desired conductivity type into said additional material where exposed by said additional patterned conductive thin film layer; whereby monocrystalline portions of said additional material beneath said additional patterned conductive thin film layer form transistor channel regions, and polycrystalline portions of said additional material provide source and drain regions adjacent thereto.

According to another disclosed class of innovative embodiments, there is provided: A method for fabricating CMOS integrated circuit devices, comprising the steps of: providing a substrate which includes at least one substantially monolithic body of semiconductor material, having at least one first-conductivity-type surface region and at least one second-conductivity-type surface region; covering part of the surface of said monolithic body with a patterned dielectric layer, said patterned dielectric layer leaving said monolithic body exposed in transistor channel locations; forming additional semiconductor material, as monocrystalline semiconductor material on said monolithic body in said transistor channel locations, and as polycrystalline semiconductor material elsewhere; said additional material being formed to a thickness greater than the thickness of said patterned dielectric layer; implanting an oxidizing species at an energy which forms a buried dielectric layer in said channel regions, and patterning said additional material to form a patterned thin film layer, and forming a gate dielectric on said additional material; forming an additional patterned conductive thin film layer on said gate dielectric; implanting first-conductivity-type dopants over locations of said second-conductivity-type regions of said body, and implanting second-conductivity-type dopants over locations of said first-conductivity-type regions of said body, to dope said additional material where exposed by said additional patterned conductive thin film layer; whereby monocrystalline portions of said additional material beneath said additional patterned conductive thin film layer form transistor channel regions, and polycrystalline portions of said additional material provide source and drain regions adjacent thereto.

According to another disclosed class of innovative embodiments, there is provided: An integrated circuit field-effect transistor structure, comprising: a monocrystalline semiconductor channel region; a conductive gate capacitively coupled to said channel region; a monocrystalline semiconductor body region which underlies and is epitaxially continuous with said channel region; first and second polycrystalline semiconductor source/drain regions which laterally adjoin opposing sides of said channel region, and each extend continuously therefrom; a first patterned dielectric layer, which underlies said source/drain regions but not said channel region; said patterned dielectric layer being thinner than said semiconductor source/drain regions; and a second patterned dielectric layer, which underlies said channel region and is thinner than said first patterned dielectric layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

Optionally, the source/drain implantation can be done as a two-step process, using sidewall dielectrics for self-aligned masking of the N+ implant, just as is conventionally done to form LDD regions.

For another example, the conventional field oxide 220 can be deleted if desired: since the active devices are not connected to the substrate, conduction in the substrate is not a concern. However, this oxide does provide advantages in capacitance and defect reduction.

For another example, the heavy oxygen implant does not have to be fully unpatterned, but can optionally be patterned using an oxide or nitride hardmask.

For another example, the etch which patterns the oxide at the channel edges can be tailored, if desired, to provide an edge contour which is not vertical.

For another example, the annealing conditions can readily be adjusted to vary the distance to which lateral epitaxial growth produces crystalline material over the oxide.

For another example, a lateral extension of the first polysilicon layer, normal to the channel, can be used to provide a back-bias (body) connection for the transistor.

For another example, the illustrated sample embodiment uses a P-well 104 and an N-well 102, but these really just serve to provide back-bias (due to electrostatic coupling through the buried oxide 499). It is not necessary to use both of these wells, since the doping of one may be supplied by the substrate, but both have been illustrated to make clear that the choice of an N-well, P-well, or twin-tub process is completely indifferent. A backside contact normally defines the substrate potential, but it is not necessary to make contact to the well (since it will bias itself, with respect to the substrate, at the built-in potential of its junction).

For another example, lateral npn and pnp transistors can easily be manufactured in the same process.

For another example, a patterned etch can be used to cut contacts through oxide to the bulk silicon if this is desired for other devices.

For another example, a nitride layer can optionally be patterned over the pad oxide to provide selective oxidation and oxide implantation if desired.

For example, it may also be possible, alternatively and less preferably, to obtain the disclosed structure by laser or e-beam annealing recrystallization methods.

For another example, it should be noted that it is not necessary to use the disclosed epitaxial portions only for transistors. Since the gate oxide overlies the epitaxial portions, these portions would be used also for MOS capacitors.

It is also possible to use counterdoping or other mask-saving tricks adapted from conventional CMOS processes.

It is also possible to implant nitrogen instead of oxygen, to form a buried nitride layer rather than a buried oxide layer. It may also be possible to implant carbon to form a buried Si/SiC layer, whose wider bandgap and high defect density would also inhibit conduction.

When the P+ and N+ implants which dope poly1 are performed, the masking can optionally be adjusted to leave part of poly1 undoped. Such intrinsic material has a very high sheet resistance, and can be used for a variety of purposes (even in a CMOS structure), e.g. defining power-on states, providing low-power voltage divider chains, power-supply-dropping in very-low-power circuits, and rad-hard gates (using a resistor interposed between the two nodes of a CMOS latch).

What is claimed is:

1. A method for fabricating integrated circuit devices, comprising the steps of:
   (a.) providing a monolithic semiconductor material;
   (b.) covering part of the surface of said monolithic material with a patterned dielectric layer, said patterned dielectric layer leaving said monolithic material exposed in transistor channel locations;
   (c.) forming additional semiconductor material as monocrystalline semiconductor material on said transistor channel locations and as polycrystalline semiconductor material elsewhere, said additional semiconductor material being formed to a thickness which is greater than the thickness of said patterned dielectric layer;
   (d.) implanting an oxidizing species at an energy which forms respective buried dielectric layers in said transistor channel locations, patterning said additional semiconductor material to form a patterned thin film layer, and forming a gate dielectric on said additional semiconductor material;
   (e.) forming an additional patterned conductive thin film layer on said gate dielectric; and
   (f.) implanting dopants of a desired conductivity type into said additional semiconductor material where exposed by said additional patterned conductive thin film layer;
   whereby monocrystalline portions of said additional semiconductor material beneath said additional patterned conductive thin film layer form transistor channel regions, and polycrystalline portions of said additional semiconductor material provide source and drain regions adjacent thereto.

2. The method of claim 1 wherein said monolithic and said additional semiconductor materials are silicon.

3. The method of claim 1, wherein said oxidizing species is oxygen.

4. The method of claim 1, wherein said oxidizing species is nitrogen.

5. The method of claim 1, wherein said oxidizing species is implanted at a dose of less than $10^{18}$ cm$^{-2}$.

6. The method of claim 1, wherein said oxidizing species is implanted at a dose in the range of about 1 to about 3 times $10^{17}$ cm$^{-2}$.

7. The method of claim 1 wherein said oxidizing species is annealed, after said implanting step (d), at a peak temperature which is less than 1100° C.

8. The method of claim 1 wherein said oxidizing species is annealed, after said implanting step (d), at a peak temperature which is less than 1100° C., and for a total annealing time which includes less than one hour above 900° C.

9. The method of claim 1 wherein said buried dielectric layers extend continuously, beneath said respective channel regions, to join with said patterned dielectric layer and thereby provide full dielectric isolation of said channel regions.

10. The method of claim 1, wherein said patterned dielectric layer and said gate dielectric both consist of silicon dioxide.

11. The method of claim 1, further comprising the additional step of forming a sidewall spacer on said additional patterned conductive thin film layer prior to said implanting step (f.).

12. The method of claim 1, further comprising the additional step of doping said additional semiconductor material prior to said forming step (e.).

13. The method of claim 1, further comprising the additional step of forming at least one first-conductivity-type surface region and at least one second-conductivity-type surface region prior to said covering step (b.).

14. The method of claim 1, further comprising the additional step of forming a patterned thick field dielectric region, which is more than twice as thick as said patterned dielectric layer, prior to said covering step (b.).

15. The method of claim 1, wherein said additional patterned conductive thin film layer comprises polycrystalline semiconductor material.

16. A method for fabricating integrated circuit devices, comprising the steps of:
   (a.) providing a monolithic semiconductor material;
   (b.) covering part of the surface of said monolithic material with a patterned dielectric layer which leaves said monolithic material exposed in transistor channel locations;
   (c.) depositing additional semiconductor material over all, as epitaxially matched monocrystalline semiconductor material on said monolithic material in said transistor channel locations, and as polycrystalline semiconductor material elsewhere, said additional semiconductor material being formed to a thickness which is greater than the thickness of said patterned dielectric layer;

(d.) implanting an oxidizing species at an energy which forms respective buried dielectric layers in said transistor channel locations to isolate said additional semiconductor material from said monolithic material in said transistor channel locations, patterning said additional semiconductor material to form a patterned thin film layer, and forming a gate dielectric on said additional semiconductor material;

(e.) forming an additional patterned conductive thin film layer, comprising polycrystalline semiconductor material, on said gate dielectric; and (f) implanting dopants of a desired conductivity type into said additional semiconductor material where exposed by said additional patterned conductive thin film layer;

whereby monocrystalline portions of said additional semiconductor material beneath said additional patterned conductive thin film layer form transistor channel regions, and polycrystalline portions of said additional material provide source and drain regions adjacent thereto.

17. The method of claim 16, wherein said oxidizing species is oxygen.

18. The method of claim 16, wherein said oxidizing species is nitrogen.

19. The method of claim 16, wherein said oxidizing species is implanted at a dose of less than $10^{18}$ cm$^{-2}$.

20. The method of claim 16, wherein said oxidizing species is implanted at a dose in the range of about 1 to about 3 times $10^{17}$ cm$^{-2}$.

21. The method of claim 16 wherein said oxidizing species is annealed, after said implanting step (d), at a peak temperature which is less than 1100° C.

22. The method of claim 16 wherein said oxidizing species is annealed, after said implanting step, at a peak temperature which is less than 1100° C., and for a total annealing time which includes less than one hour above 900° C.

23. The method of claim 16 wherein said buried dielectric layers extend continuously, beneath said respective channel regions, to join with said patterned dielectric layer and thereby provide full dielectric isolation of said channel regions.

24. The method of claim 16 wherein said monolithic and said additional semiconductor materials are silicon.

25. The method of claim 16, wherein said patterned dielectric layer and said gate dielectric both consist of silicon dioxide.

26. The method of claim 16, further comprising the additional step of forming a sidewall spacer on said additional patterned conductive thin film layer prior to said implanting step (f.).

27. The method of claim 16, further comprising the additional step of doping said additional semiconductor material prior to said forming step (e.).

28. The method of claim 16, further comprising the additional step of forming at least one first-conductivity-type surface region and at least one second-conductivity-type surface region prior to said covering step (b.).

29. The method of claim 16, further comprising the additional step of forming a patterned thick field dielectric region, which is more than twice as thick as said patterned dielectric layer, prior to said covering step (b.).

30. The method of claim 16, wherein said additional patterned conductive thin film layer comprises polycrystalline semiconductor material.

* * * * *

UNITED STATES PATENT AND TRADEMARK OFFICE
CERTIFICATE OF CORRECTION

PATENT NO. : 5,773,328
DATED : June 30, 1998
INVENTOR(S) : Richard A. Blanchard

It is certified that error appears in the above-identified patent and that said Letters Patent is hereby corrected as shown below:

Under 'DETAILED DESCRIPTION OF THE PREFERRED EMBODIMENT', column 6, at line 16, replace the word 'low-dose' with the word 'high-dose'.

Signed and Sealed this

Second Day of March, 1999

*Attest:*

Q. TODD DICKINSON

*Attesting Officer*  *Acting Commissioner of Patents and Trademarks*